United States Patent
Heo et al.

(10) Patent No.: US 9,627,636 B2
(45) Date of Patent: Apr. 18, 2017

(54) FLEXIBLE DISPLAY APPARATUS AND MANUFACTURING METHOD THEREOF

(71) Applicant: SAMSUNG DISPLAY CO., LTD., Yongin, Gyeonggi-Do (KR)

(72) Inventors: Jun Heo, Yongin (KR); Sungguk An, Yongin (KR); Sungsik Bae, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/736,893

(22) Filed: Jun. 11, 2015

(65) Prior Publication Data

US 2016/0181338 A1 Jun. 23, 2016

(30) Foreign Application Priority Data

Dec. 19, 2014 (KR) .................. 10-2014-0184956

(51) Int. Cl.
*H01L 27/32* (2006.01)
*H01L 51/00* (2006.01)

(52) U.S. Cl.
CPC .. *H01L 51/0097* (2013.01); *H01L 2251/5338* (2013.01)

(58) Field of Classification Search
CPC . H01L 27/32; H01L 27/3248; H01L 27/3251; H01L 27/1259
See application file for complete search history.

(56) References Cited

U.S. PATENT DOCUMENTS

| | | | |
|---|---|---|---|
| 8,337,800 B2 | 12/2012 | Nishikawa et al. | |
| 2006/0183812 A1* | 8/2006 | Miller | A61L 9/014 523/102 |
| 2008/0048156 A1 | 2/2008 | Ahn et al. | |
| 2010/0213819 A1 | 8/2010 | Cok et al. | |
| 2010/0320450 A1 | 12/2010 | Fujioka | |
| 2011/0052836 A1 | 3/2011 | Kim et al. | |
| 2011/0134018 A1 | 6/2011 | Seo et al. | |
| 2012/0187380 A1* | 7/2012 | Wu | B82Y 10/00 257/40 |
| 2013/0105203 A1 | 5/2013 | Lee et al. | |
| 2013/0164210 A1 | 6/2013 | Ohta et al. | |
| 2013/0236681 A1* | 9/2013 | Lee | C09D 183/06 428/68 |
| 2015/0123098 A1* | 5/2015 | Kang | H01L 51/5253 257/40 |
| 2015/0311468 A1 | 10/2015 | An et al. | |

FOREIGN PATENT DOCUMENTS

| | | |
|---|---|---|
| JP | 2009-166252 | 7/2009 |
| KR | 10-2008-0012147 | 2/2008 |
| KR | 10-2009-0047885 A | 5/2009 |
| KR | 10-2010-0124012 A | 11/2010 |

(Continued)

*Primary Examiner* — Phuc Dang
(74) *Attorney, Agent, or Firm* — Lee & Morse, P.C.

(57) ABSTRACT

A flexible display apparatus includes a first flexible substrate including carbon, a second flexible substrate on the first flexible substrate, a metal layer between the first flexible substrate and the second flexible substrate, a barrier layer on the second flexible substrate, a thin film transistor (TFT) on the barrier layer, and an organic light-emitting device (OLED) electrically connected to the TFT.

14 Claims, 10 Drawing Sheets

(56) References Cited

FOREIGN PATENT DOCUMENTS

| | | |
|---|---|---|
| KR | 10-2011-0023138 | 3/2011 |
| KR | 10-2011-0062382 | 6/2011 |
| KR | 10-1063361 B1 | 9/2011 |
| KR | 10-2011-0134419 | 12/2011 |
| KR | 10-2012-0006844 | 1/2012 |
| KR | 10-2012-0033285 A | 4/2012 |
| KR | 10-2013-0021566 A | 3/2013 |
| KR | 10-2013-0026008 A | 3/2013 |
| KR | 10-2015-0125151 A | 11/2015 |
| WO | WO-2012/026408 A1 | 3/2012 |

* cited by examiner

FLEXIBLE DISPLAY APPARATUS AND MANUFACTURING METHOD THEREOF

CROSS-REFERENCE TO RELATED APPLICATION

Korean Patent Application No. 10-2014-0184956, filed on Dec. 19, 2014, in the Korean Intellectual Property Office, and entitled: "Flexible Display Apparatus and Manufacturing Method Thereof," is incorporated by reference herein in its entirety.

BACKGROUND

1. Field

Embodiments relate to a flexible display apparatus and a method of manufacturing the same.

2. Description of the Related Art

Recently, as interest in flexible display apparatuses has increased, research into flexible display apparatuses has been actively conducted.

SUMMARY

Embodiments are directed to a flexible display apparatus including a first flexible substrate including carbon, a second flexible substrate on the first flexible substrate, a metal layer between the first flexible substrate and the second flexible substrate, a barrier layer on the second flexible substrate, a thin film transistor (TFT) on the barrier layer, and an organic light-emitting device (OLED) electrically connected to the TFT.

The first flexible substrate may have a carbon ratio that is 60% or higher.

The flexible display apparatus may further include a metal oxide layer between the metal layer and the second flexible substrate.

The second flexible substrate has a thickness of about 5 μm to about 50 μm.

The first flexible substrate and the second flexible substrate may include a polymer organic material.

Embodiments are also directed to a method of manufacturing a flexible display apparatus including forming a first flexible substrate by forming a first polymer layer on a supporting layer and carbonizing or graphitizing the first polymer layer, forming a metal layer on the first flexible substrate, forming a second flexible substrate by forming a second polymer layer on the metal layer, forming a barrier layer on the second flexible substrate, forming a thin film transistor (TFT) on the barrier layer, and forming an organic light-emitting device (OLED) electrically connected to the TFT.

Forming the first flexible substrate may include forming the first flexible substrate such that the first flexible substrate has a carbon ratio that is 60% or higher.

The method may further include forming a metal oxide layer after forming the metal layer and before forming the second flexible substrate.

Forming the metal oxide layer may include oxidizing a surface of the metal layer.

Forming the first flexible substrate may include carbonizing the first polymer layer at a temperature of about 300° C. to about 4,000° C.

Forming the second flexible substrate may include forming the second flexible substrate such that the second flexible substrate has a thickness of about 5 μm to about 50 μm.

Embodiments are also directed to a flexible substrate including a first polymer layer having a carbon ratio that is 60% or higher, a second polymer layer on the first polymer layer, a metal layer between the first polymer layer and the second polymer layer, and a barrier layer disposed on the second polymer layer.

A metal oxide layer may be between the metal layer and the second polymer layer.

The second polymer layer may have a thickness of about 5 μm to about 50 μm.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
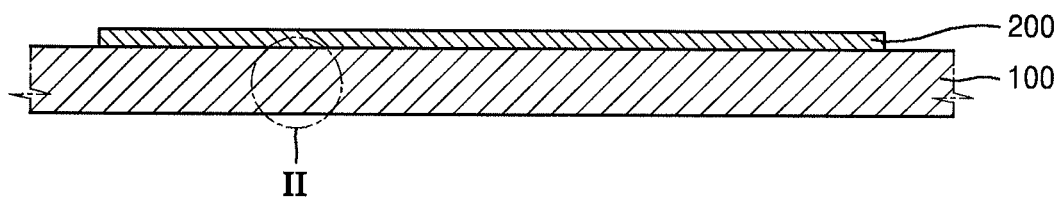
FIG. 1 illustrates a cross-sectional view depicting a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

When a certain embodiment may be implemented differently, a specific process order may be performed differently from the described order. For example, two consecutively described processes may be performed substantially at the same time or performed in an order opposite to the described order.

Figure 2:
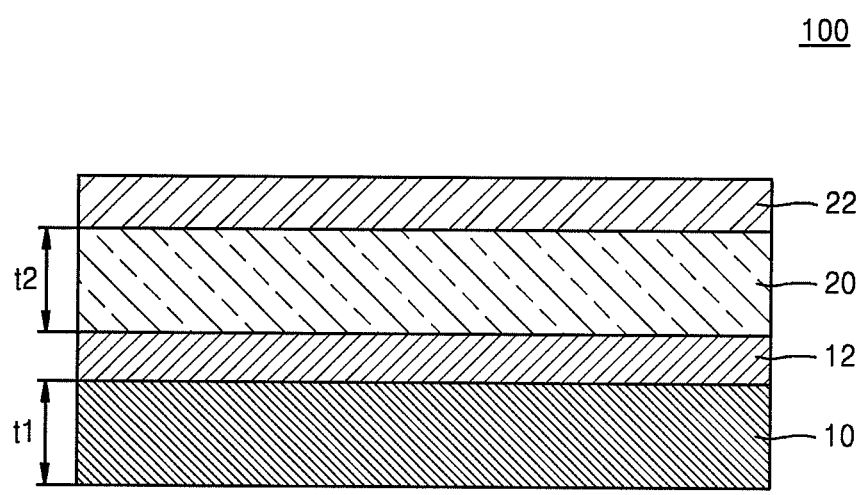
FIG. 2 illustrates a cross-sectional view depicting in detail a flexible substrate of the flexible display apparatus of FIG. 1.

FIG. 1 is a cross-sectional view depicting a flexible display apparatus according to an embodiment. FIG. 2 is a cross-sectional view depicting in detail a flexible substrate 100 of the flexible display apparatus of FIG. 1.

Referring to FIGS. 1 and 2, the flexible display apparatus according to the present embodiment may include a substrate 100 and a display unit 200 disposed on the substrate 100. The substrate 100 may be formed as a multi-layer and may include a first flexible substrate 10, a metal layer 12 disposed on the first flexible substrate 10, a second flexible substrate 20 disposed on the metal layer 12, and a barrier layer 22 disposed on the second flexible substrate 20. The display unit 200 may include a thin film transistor (TFT) and an organic light-emitting device (OLED) 240 (refer to FIG. 5) electrically connected to the TFT.

The first flexible substrate 10 may have a flexible characteristic and may be, for example a plate having a predetermined thickness. A thickness t1 of the plate-shaped first flexible substrate 10 may be, for example, about 5 µm to about 50 µm, or, for example, about 20 µm to about 40 µm.

The first flexible substrate 10 may be formed by carbonizing a plastic material, such as polyethylene terephthalate (PET), polyethylene naphthalate (PEN), or polyimide, or another polymer material, such as PBO, PBI, polyoxadiazole (POD), polytriazole, or polyacylonitirile (PAN), in order to provide excellent thermal resistance and durability, and flexible characteristics. The first flexible substrate 10 includes carbon. For example, the first flexible substrate 10 may be formed to have a carbon ratio that is 60% or higher.

The second flexible substrate 20 may be disposed on the first flexible substrate 10. The second flexible substrate 20 may have a flexible characteristic, and may be a plate having a predetermined thickness. A thickness t2 of the plate-shaped second flexible substrate 20 may be, for example, about 5 µm to about 50 µm, or, for example about 20 µm to 40 µm.

The second flexible substrate 20 may be formed of a plastic material, such as PET, PEN, or polyimide, or another polymer material, such as PBO, PBI, POD, polytriazole, or PAN, in order to have excellent thermal resistance and durability, and flexible characteristics.

The metal layer 12 may be interposed between the first flexible substrate 10 and the second flexible substrate 20. The metal layer 12 may be formed of at least one conductive material selected from Al, Pt, Pd, Ag, Mg, Au, Ni, Nd, Ir, Cr, Li, Ca, Mo, Ti, W, and Cu, as a single layer or as multiple layers.

The metal layer 12 may be interposed between the first flexible substrate 10 and the second flexible substrate 20 to prevent static electricity. The metal layer 12 may release heat generated in the display unit 200 to the outside, by being formed of a metal material. A conductive and heat dissipating sheet, such as is generally fixed below the substrate 100, may be omitted. Such a heat dissipating sheet may decrease the flexibility of a substrate decreased due to a thickness of the heat dissipating sheet. According to the present embodiment, the flexibility of the substrate 100 may be improved by omitting a heat dissipating sheet. By using the characteristic of the metal layer 12 that is formed of the metal material, rigidity of the substrate 100 may be secured and a barrier characteristic with respect to moisture or air permeating from a bottom portion of the first flexible substrate 10 may be obtained.

The barrier layer 22 may be disposed on the second flexible substrate 20. The barrier layer 22 may be formed of an inorganic layer. For example, the barrier layer 22 may be formed of silicon oxide and/or silicon nitride. The barrier layer 22 may be disposed between the display unit 200 disposed above the second flexible substrate 20 and the second flexible substrate 20 such that a barrier characteristic with respect to moisture and air permeating from a bottom portion of the second flexible substrate 20 through the display unit 200 may be intensified.

As described above, the flexible display apparatus according to the present embodiment includes the first flexible substrate 10 including carbon, thereby securing a greater thermal resistance compared to a general plastic substrate. The first flexible substrate 10 including carbon may have a greater heat conductivity compared to a plastic material, and may contribute to process simplification and cost reduction by replacing an expensive heat dissipating sheet used in a module process for heat dissipation. According to the present embodiment, flexibility of the substrate 100 may be improved due to the elimination of the heat dissipating sheet.

Figure 3:
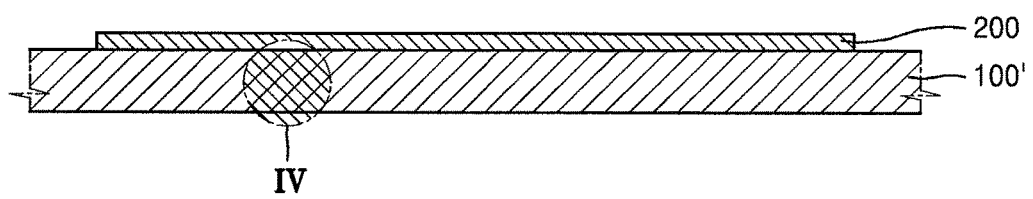
FIG. 3 illustrates a cross-sectional view depicting a flexible display apparatus according to another embodiment.
Figure 4:
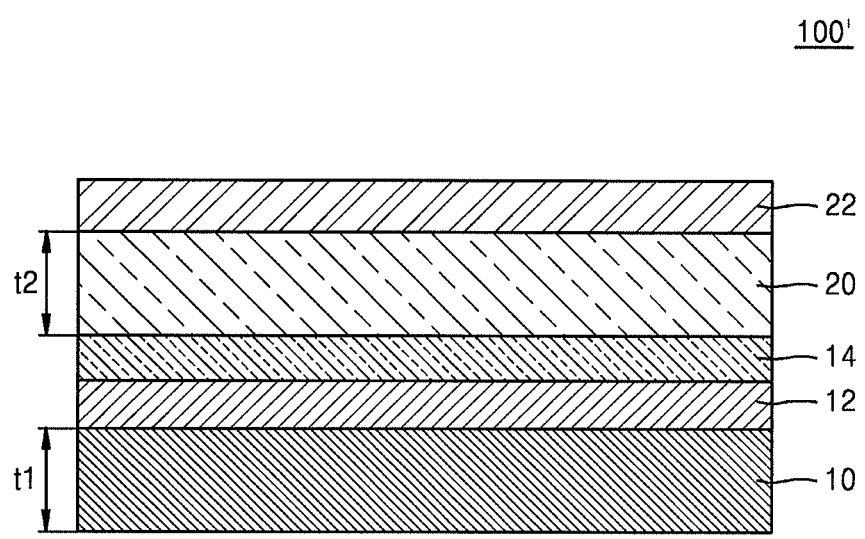
FIG. 4 illustrates a cross-sectional view depicting in detail a flexible substrate of the flexible display apparatus of FIG. 3.

FIG. 3 is a cross-sectional view depicting a flexible display apparatus according to another embodiment. FIG. 4 is a cross-sectional view depicting in detail a flexible substrate 100' of the flexible display apparatus of FIG. 3.

Referring to FIGS. 3 and 4, the flexible display apparatus according to the present embodiment may include the substrate 100' and the display unit 200 disposed on the substrate 100'. The substrate 100' may be formed as multi-layers and may include the first flexible substrate 10, the metal layer 12 disposed on the first flexible substrate 10, a metal oxide layer 14 disposed on the metal layer 12, the second flexible substrate 20 disposed on the metal oxide layer 14, and the barrier layer 22 disposed on the second flexible substrate 20. The display unit 200 may include a TFT and an OLED 240 (refer to FIG. 5) electrically connected to the TFT.

The first flexible substrate 10 may have a flexible characteristic, and may be a plate having a predetermined thickness. A thickness t1 of the plate-shaped first flexible substrate 10 may be, for example, about 5 µm to about 50 µm, or, for example, about 20 µm to about 40 µm.

The first flexible substrate 10 may be formed by carbonizing a plastic material, such as polyethylene terephthalate (PET), polyethylene naphthalate (PEN), and polyimide, or e polymer material, such as PBO, PBI, polyoxadiazole (POD), polytriazole, and polyacylonitirile (PAN), in order to provide excellent thermal resistance and durability, and flexible characteristics. Accordingly, the first flexible substrate 10 may include carbon. For example, the first flexible substrate 10 may be formed to have a carbon ratio that is 60% or higher.

The second flexible substrate 20 may be disposed on the first flexible substrate 10. The second flexible substrate 20 may have a flexible characteristic, and may be a plate having a predetermined thickness. A thickness t2 of the plate-shaped second flexible substrate 20 may be, for example, about 5 µm to about 50 µm, or, for example, about 20 µm to about 40 µm.

The second flexible substrate 20 may be formed of a plastic material, such as PET, PEN, and polyimide, or a polymer material, such as PBO, PBI, POD, polytriazole, and PAN, in order to provide excellent thermal resistance and durability, and flexible characteristics.

The metal layer 12 may be interposed between the first flexible substrate 10 and the second flexible substrate 20. The metal layer 12 may be formed of at least one conductive material selected from Al, Pt, Pd, Ag, Mg, Au, Ni, Nd, Ir, Cr, Li, Ca, Mo, Ti, W, and Cu, as a single layer or as multiple layers.

The metal layer 12 may be interposed between the first flexible substrate 10 and the second flexible substrate 20 to prevent static electricity. Also, the metal layer 12 may release heat generated in the display unit 200 to the outside, by being formed of a metal material. A conductive and heat dissipating sheet, such as is generally fixed below the substrate 100', may be omitted. Such a heat dissipating sheet may decrease flexibility of a substrate the due to a thickness of the heat dissipating sheet. However, according to the present embodiment, the flexibility of the substrate 100' may be improved by omitting the heat dissipating sheet. By using the characteristic of the metal layer 12 that is formed of the metal material, rigidity of the substrate 100' may be secured and a barrier characteristic with respect to moisture or air permeating from a bottom portion of the first flexible substrate 10 may be obtained.

The metal oxide layer 14 may be disposed on the metal layer 12. The metal oxide layer 14 may be formed by oxidizing a surface of the metal layer 12 when the metal layer 12 is formed, or may be formed by using an additional process. Materials of the metal oxide layer 14 may include various metal oxides. As described above, the metal oxide layer 14 may be further disposed on the metal layer 12. Thus, double barrier functions of the metal layer 12 and the metal oxide layer 14 may be performed.

The barrier layer 22 may be disposed on the second flexible substrate 20. The barrier layer 22 may be formed of an inorganic layer. For example, the barrier layer 22 may be formed of silicon oxide and/or silicon nitride. The barrier layer 22 may be disposed between the display unit 200 disposed above the second flexible substrate 20 and the second flexible substrate 20 such that a barrier characteristic with respect to moisture and air permeating from a bottom portion of the second flexible substrate 20 through the display unit 200 may be intensified.

As described above, the flexible display apparatus according to the present embodiment includes the first flexible substrate 10 including carbon, thereby securing a greater thermal resistance compared to a general plastic substrate. The first flexible substrate 10 including carbon may have a greater heat conductivity compared to a plastic material, and, may contribute to process simplification and cost reduction by replacing an expensive heat dissipating sheet used in a module process for heat dissipation. According to the present embodiment, flexibility of the substrate 100' may be improved due to the elimination of the heat dissipating sheet.

Figure 5:
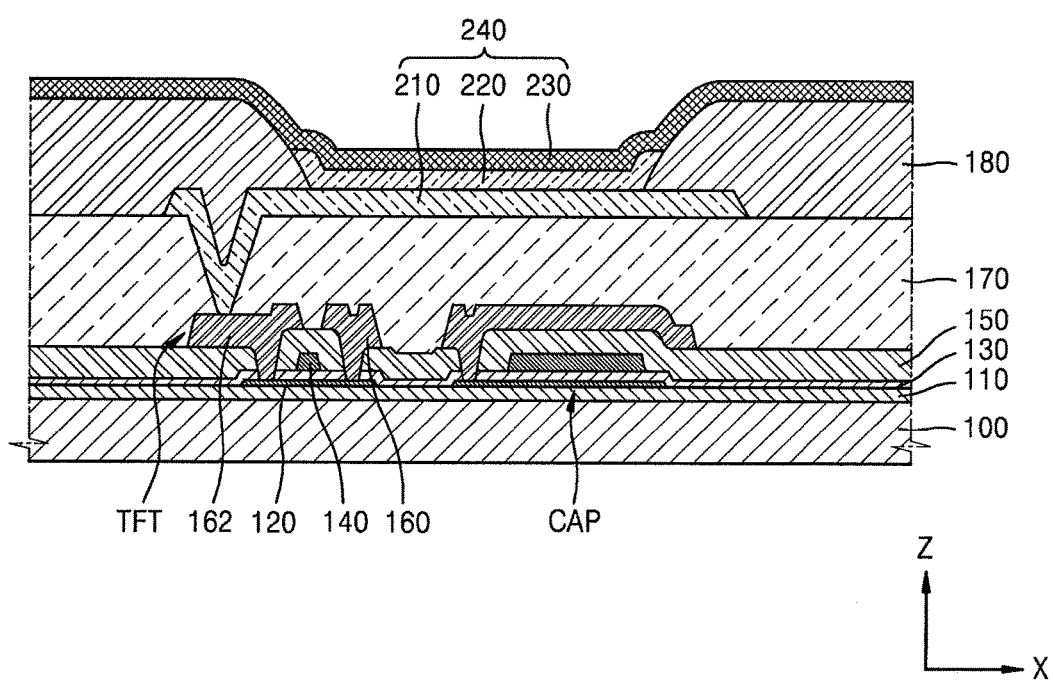
FIG. 5 illustrates a cross-sectional view depicting in detail the flexible display apparatus of FIG. 1.

FIG. 5 is a cross-sectional view depicting in detail the flexible display apparatus of FIG. 1. A structure and function of the display unit 200 disposed on the substrate 100 will be described in detail by referring to FIG. 5.

The display unit 200 is disposed on the substrate 100. The display unit 200 includes s TFT and a capacitor CAP, and may include an OLED 240 electrically connected to the TFT. The TFT may include a semiconductor layer 120 including amorphous silicon, poly crystalline silicon, or an organic semiconductor material, a gate electrode 140, and a source electrode 160 and a drain electrode 162. Hereinafter, a general structure of the TFT will be described in detail.

First, a buffer layer 110 formed of silicon oxide or silicon nitride may be disposed on the substrate 100 in order to planarize a surface of the substrate 100 or to prevent the penetration of impurities into the semiconductor layer 120 of the TFT. The semiconductor layer 120 may be disposed on the buffer layer 110.

The gate electrode 140 may be disposed on the semiconductor layer 120. The source electrode 160 and the drain electrode 162 may be electrically connected to each other according to signals applied to the gate electrode 140. The gate electrode 140 may be formed of at least one material selected from Al, Pt, Pd, Ag, Mg, Au, Ni, Nd, Ir, Cr, Li, Ca, Mo, Ti, W, and Cu, as a single layer or as multiple layers, in consideration of adhesion to adjacent layers, surface flatness of a layer on which the gate electrode 140 is stacked, and processability.

To insulate between the semiconductor layer 120 and the gate electrode 140, a gate insulating layer 130 formed of silicon oxide and/or silicon nitride may be interposed between the semiconductor layer 120 and the gate electrode 140.

An interlayer insulating layer 150 may be disposed on the gate electrode 140. The interlayer insulating layer 150 may be formed of silicon oxide or silicon nitride as a single layer or multiple layers.

The source electrode 160 and the drain electrode 162 may be disposed on the interlayer insulating layer 150. Each of the source electrode 160 and the drain electrode 162 may be electrically connected to the semiconductor layer 120 through a contact hole formed in the interlayer insulating layer 150 and the gate insulating layer 130. The source electrode 160 and the drain electrode 162 may be formed of at least one material selected from Al, Pt, Pd, Ag, Mg, Au, Ni, Nd, Ir, Cr, Li, Ca, Mo, Ti, W, and Cu, as a single layer or multiple layers, in consideration of conductivity.

A protective layer may be disposed to cover and protect the TFT. The protective layer may be formed of an inorganic material, such as silicon oxide, silicon nitride, or silicon oxynitride.

A first insulating layer 170 may be disposed on the substrate 100. The first insulating layer 170 may be a planarization layer or a protective layer. When the OLED 240 is disposed on the TFT, the first insulating layer 170 may approximately planarize an upper surface of the TFT and protect the TFT and various devices. The first insulating layer 170 may be formed of, for example, an acryl-based organic material or benzocyclobutene (BCB). The buffer layer 110, the gate insulating layer 130, the interlayer insulating layer 150, and the first insulating layer 170 may be formed throughout the substrate 100.

A second insulating layer 180 may be disposed on the TFT. The second insulating layer 180 may be a pixel-defining layer. The second insulating layer 180 may be disposed on the first insulating layer 170 and may have an opening. The second insulating layer 180 may define a pixel area on the substrate 100.

The second insulating layer 180 may be formed of, for example, an organic insulating layer. The organic insulating layer may include an acryl-based polymer such as polymethylmethacrylate (PMMA), polystyrene (PS), a polymer derivative having a phenol group, an imide-based polymer, an aryl ether-based polymer, an amide-based polymer, a fluorine-based polymer, a p-xylene-based polymer, a vinyl alcohol-based polymer, or a mixtures thereof.

The OLED 240 may be disposed on the second insulating layer 180. The OLED 240 may include a pixel electrode 210, an intermediate layer 220 including an emission layer (EML), and an opposite electrode 230.

The pixel electrode 210 may be formed as a transparent or semi-transparent electrode or as a reflective electrode. When the pixel electrode 210 is formed as a transparent or semi-transparent electrode, the pixel electrode 210 may be formed of, for example, ITO, IZO, ZnO, $In_2O_3$, IGO, or AZO. When the pixel electrode 210 is formed as a reflective electrode, the pixel electrode 210 may include a reflective layer formed of Ag, Mg, Al, Pt, Pd, Au, Ni, Nd, Ir, Cr, or a compound thereof and a layer formed of ITO, IZO, ZnO, In$_2$O$_3$, IGO, or AZO. The pixel electrode 210 may be formed as a single layer or as multiple layers.

The intermediate layer 220 may be disposed on each of pixel regions defined by the second insulating layer 180. The intermediate layer 220 may have various structures. The intermediate layer 220 may include the emission layer (EML), which emits light in response to electrical signals. Also, in addition to the EML, a hole injection layer (HIL) and a hole transport layer (HTL) disposed between the EML and the pixel electrode 210, and an electron transport layer (ETL) and an electron injection layer (EIL) disposed between the EML and the opposite electrode 230 may be stacked as a single-layered structure or a multi-layered structure.

The opposite electrode 230, which covers the intermediate layer 220 including the EML and is opposite to the pixel electrode 210, may be disposed throughout the substrate 100. Structures and materials of the opposite electrode 230 may vary. The opposite electrode 230 may be formed of a transparent or semi-transparent electrode or a reflective electrode.

When the opposite electrode 230 is formed as a transparent or semi-transparent electrode, the opposite electrode 230 may have a layer formed of a metal having a low work function, such as Li, Ca, LiF/Ca, LiF/Al, Al Ag, Mg, or a compound thereof, and a transparent or semi-transparent conductive layer formed of ITO, IZO, ZnO, or In$_2$O$_3$. When the opposite electrode 230 is formed as a reflective electrode, the opposite electrode 230 may have a layer formed of Li. Ca. LiF/Ca, LiF/Al, Al, Ag, Mg, or a compound thereof.

FIGS. 6 through 10 illustrate cross-sectional views depicting stages of a method of manufacturing a flexible display apparatus, according to an embodiment.

Figure 6:
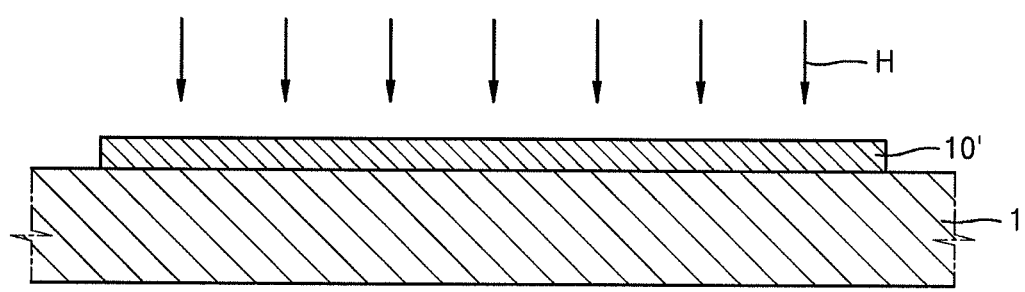
FIGS. 6 through 10 illustrate cross-sectional views depicting stages of a method of manufacturing a flexible display apparatus, according to an embodiment.

Referring to FIG. 6, a first polymer layer 10' may be formed on a supporting substrate 1. The first polymer layer 10' may be formed of a plastic material, such as PET, PEN, or polyimide, or a polymer material, such as PBO, PBI, POD, polytriazole, or PAN.

The first polymer layer 10' formed on the supporting layer 1 may be carbonized or graphitized by applying heat H on the first polymer layer 10'. The first polymer layer 10' may be carbonized or graphitized to form the first flexible substrate 10. The first polymer layer 10' may be carbonized or graphitized at a temperature of, for example, 300° C. to 4,000° C. The first polymer layer 10' may be carbonized or graphitized at a temperature within a range, for example, between 300° C. and 4000° C. If the first polymer layer 10' is carbonized or graphitized at a temperature that is greater than about 300° C., the carbonization may be sufficient. If the first polymer layer 10' is carbonized or graphitized at a temperature that is less than about 4,000° C., excessive carbonization of the polymer material may be avoided.

Figure 7:
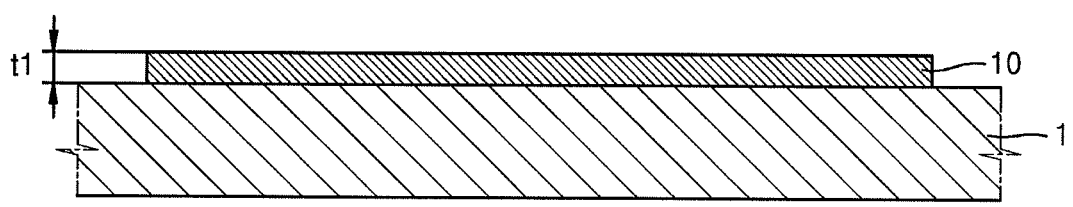

Referring to FIG. 7, the first flexible substrate 10 may be formed on the supporting substrate 1 by carbonizing or graphitizing the first polymer layer 10'. The first flexible substrate 10 that is carbonized or graphitized may have a carbon ratio that is 60% or higher. A thickness t1 of the first flexible substrate 10 may be, for example, about 5 μm to about 50 μm. For example, the thickness t1 may be about 20 μm to about 40 μm.

Figure 8:
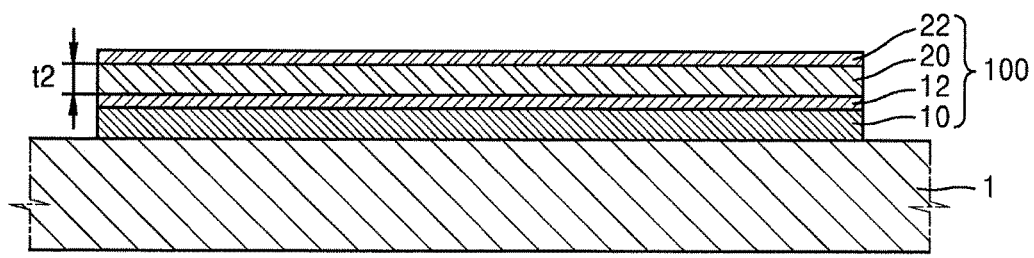

Referring to FIG. 8, the metal layer 12 may be formed on the first flexible substrate 10. The metal layer 12 may be formed of at least one conductive material selected from Al, Pt, Pd, Ag, Mg, Au, Ni, Nd, Ir, Cr, Li, Ca, Mo, Ti, W, and Cu, as a single layer or as multiple layers.

The metal layer 12 may be interposed between the first flexible substrate 10 and the second flexible substrate 20 to prevent static electricity. The metal layer 12 may release heat generated in the display unit 200 to the outside, by being formed of a metal material having high heat conductivity. Also, by using the characteristic of the metal layer 12 which is formed of the metal material, rigidity of the substrate 100 may be secured and a barrier characteristic with respect to moisture or air permeating from a bottom portion of the first flexible substrate 10 may be obtained.

The second flexible substrate 20 may be formed on the metal layer 12. The second flexible substrate 20 may be formed by forming a second polymer layer on the metal layer 12. The second flexible substrate 20 may be formed of a plastic material, such as PET, PEN, or a polyimide, or polymer material, such as PBO, PBI, POD, polytriazole, or PAN. A thickness t2 of the second flexible substrate 20 may be, for example, about 5 μm to about 50 μm. For example, the thickness t2 may be about 20 μm to about 40 μm.

The barrier layer 22 may be formed on the second flexible substrate 20. The barrier layer 22 may be formed of an inorganic layer. For example, the barrier layer 22 may be formed of silicon oxide and/or silicon nitride.

Figure 9:
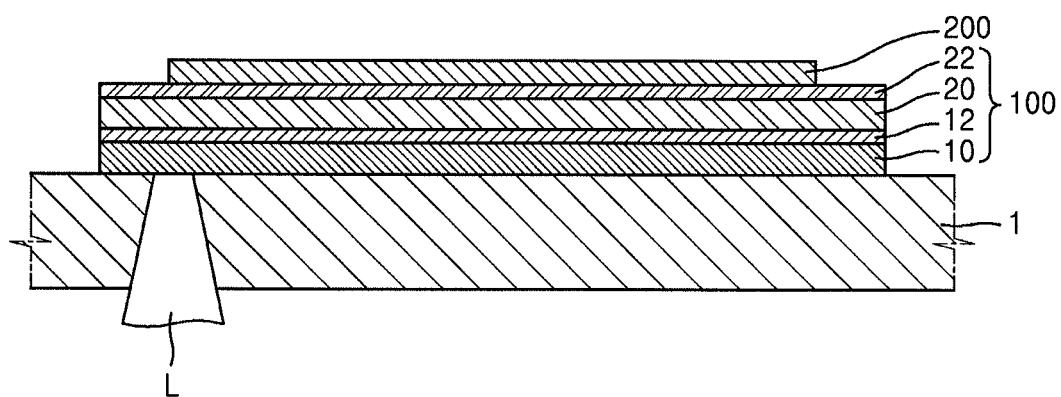

Referring to FIG. 9, the display unit 200 may be formed on the substrate 100. The display unit 200 may include the TFT, a capacitor CAP, and various devices, such as wiring units. Also, the display unit 200 may include the OLED 240. Structures of the display unit 200 are illustrated in FIG. 5. Materials of the TFT and the OLED 240 may be the same as those described above, and thus, descriptions thereof will not be repeated.

Referring to FIG. 5, the TFT may include the buffer layer 110, which is formed on the substrate 100 by using silicon oxide or silicon nitride in order to planarize a surface of the substrate 100 or to prevent penetration of impurities into the semiconductor layer 120. The semiconductor layer 120 including amorphous silicon, polycrystalline silicon, or an organic semiconductor material may be patterned on the buffer layer 110.

To insulate between the semiconductor layer 120 and the gate electrode 140, the gate insulating layer 130 may be formed of silicon oxide and/or silicon nitride on the semiconductor layer 120. The gate electrode 140 including amorphous silicon, polycrystalline silicon, or an organic semiconductor material may be patterned on the gate insulating layer 130. The source electrode 160 and the drain electrode 162 may be electrically connected to each other according to signals applied to the gate electrode 140.

The interlayer insulating layer 150 may be formed on the gate electrode 140. The interlayer insulating layer 150 may be formed of silicon oxide or silicon nitride as a single layer or as multiple layers.

The source electrode 160 and the drain electrode 162 may be formed on the interlayer insulating layer 150. Each of the source electrode 160 and the drain electrode 162 may be electrically connected to the semiconductor layer 120 through a contact hole formed in the interlayer insulating layer 150 and the gate insulating layer 130.

The first insulating layer 170 may be formed on the TFT. The first insulating layer 170 may be a planarization layer or a protective layer.

A protective layer covering the TFT may be further be formed to protect the TFT. The protective layer may be formed of an inorganic material, such as silicon oxide, silicon nitride, or silicon oxynitride. The protective layer may have various structures. For example, the protective layer may have a single-layered or a multi-layered structure.

The gate insulating layer 130, the interlayer insulating layer 150, and the first insulating layer 170 may be formed over the entire substrate 100.

The OLED 240 may be formed on the first insulating layer 170. The OLED 240 may include the pixel electrode 210, the intermediate layer 220 including the EML, and the opposite electrode 230.

The pixel electrode 210 may be disposed on the first insulating layer 170 or the planarization layer. The first insulating layer 170 may include an opening that exposes at least one of the source electrode 160 and the drain electrode 162 of the TFT. The pixel electrode 210 may contact any one of the source electrode 160 and the drain electrode 162 of the TFT through the opening in order to be electrically connected to the TFT.

The pixel electrode 210 may be formed of a transparent or semi-transparent electrode or a reflective electrode. The pixel electrode 210 may be formed of various materials and as various structures. For example, the pixel electrode 210 may have a single-layered structure or a multi-layered structure.

The second insulating layer 180 may be formed on the TFT. The second insulating layer 180 may be formed on the first insulating layer 170 and may be patterned to include an opening that exposes a central portion of the pixel electrode 210. The second insulating layer 180 may be a pixel-defining layer. A pixel area may be defined on a display area of the substrate 100 through the opening of the second insulating layer 180.

The intermediate layer 220 including an emission layer (EML) may be formed in the pixel area defined by the second insulating layer 180. The intermediate layer 220 may have various structures. The intermediate layer 220 of the OLED 240 may include the EML. In addition to the EML, at least one of an HIL, an HTL, an ETL, and an EIL may be stacked as a single-layered structure or as a multi-layered structure.

The opposite electrode 230 which covers the intermediate layer 220 including the EML and is opposite to the pixel electrode 210 may be disposed throughout the substrate 100. Structures and materials of the opposite electrode 230 may vary. For example, the opposite electrode 230 may be formed as a transparent or semi-transparent electrode or a reflective electrode.

Figure 10:
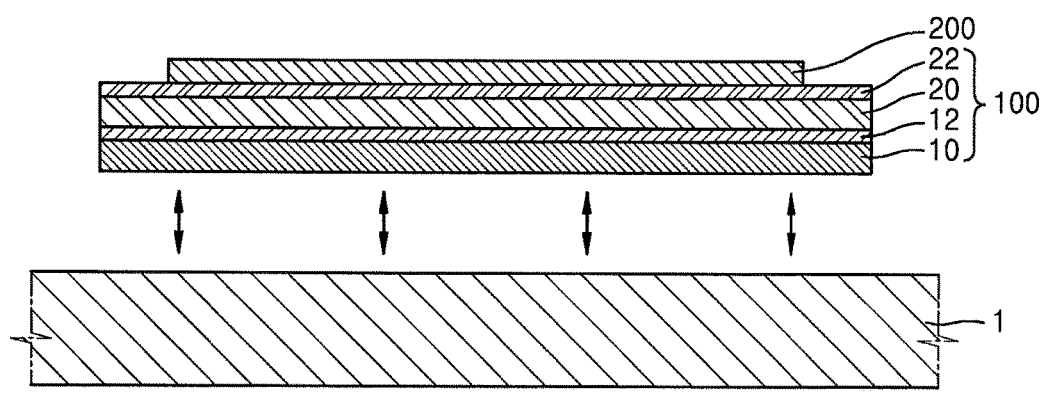

Referring to FIGS. 9 and 10, after the display unit 200 is formed on the substrate 100, the flexible display apparatus according to the present embodiment may be detached from the supporting substrate 1. The first flexible substrate 10, which is carbonized or graphitized at a high temperature, may have low adhesion at a contact interface between the first flexible substrate 10 and the supporting substrate 1. Accordingly, it may be easy to detach the substrate 100 from the supporting substrate 1.

As described above, the flexible display apparatus according to the present embodiment may include the first flexible substrate 10 formed by carbonizing or graphitizing a polymer material. Thus, the flexible display apparatus may have a higher heat resilience compared to a display apparatus including a plastic substrate. Also, when the polymer material is carbonized or graphitized, the adhesion of the contact interface between the supporting substrate I and the first flexible substrate 10 may become low. The flexible substrate 10 may be easily detached from the supporting substrate 1. When the substrate having carbon is used, a higher heat conductivity may be achieved compared to a plastic material. An expensive heat dissipating sheet generally used in a module process for heat dissipation may be omitted such that process simplification and cost reduction may be realized.

The flexible display apparatus according the present embodiment may include the metal layer 12 disposed on the first flexible substrate 10. The metal layer 12 may prevent static electricity. By using the characteristic of the metal layer 12 which is formed of the metal material, rigidity of the substrate 100 may be secured and a barrier characteristic with respect to moisture or air permeating from a bottom portion of the first flexible substrate 10 may be obtained. Also, the metal layer 12 may release heat generated in the display unit 200 to the outside, by being formed of a metal material having high heat conductivity. Thus, a conductive and heat dissipating sheet such as is generally fixed below a substrate may be omitted. When a heat dissipating sheet is fixed to a substrate, flexibility of the substrate decreases due to a thickness of the heat dissipating sheet. By omitting the heat dissipating sheet, a decrease in the flexibility of the substrate 100 may be avoided.

As described above, according to the one or more of the above exemplary embodiments, the flexible display apparatus, a structure and a manufacturing process of which are simple and which has a substrate having improved flexibility, and a method of manufacturing the flexible display apparatus, may be realized.

By way of summation and review, to form flexible display apparatuses, flexible substrates formed of, for example, a synthetic resin are generally used, instead of glass substrates. Such flexible substrates have flexible characteristics, and thus are not easy to handle in a manufacturing process. To address this issue, a flexible substrate may be formed on a supporting substrate having sufficient rigidity, and after various processes are performed on the flexible substrate, the flexible substrate may be separated from the supporting substrate.

However, in such a flexible display apparatus and such a manufacturing method thereof, since such a flexible substrate formed of a plastic has a lower heat conductivity than the glass substrate, an additional sheet was generally fixed below the flexible substrate to compensate for the lower heat conductivity. However, in this case, the flexible characteristic of the flexible substrate is deteriorated.

Embodiments provide a flexible display apparatus, a manufacturing process and a structure of which are simple, and which includes a substrate having improved flexibility, and a method of manufacturing the flexible display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A flexible display apparatus, comprising:
a first flexible substrate including carbon;

a second flexible substrate on the first flexible substrate;
a metal layer between the first flexible substrate and the second flexible substrate;
a barrier layer on the second flexible substrate;
a thin film transistor (TFT) on the barrier layer; and
an organic light-emitting device (OLED) electrically connected to the TFT.

2. The flexible display apparatus as claimed in claim 1, wherein the first flexible substrate has a carbon ratio that is 60% or higher.

3. The flexible display apparatus as claimed in claim 1, further comprising a metal oxide layer between the metal layer and the second flexible substrate.

4. The flexible display apparatus as claimed in claim 1, wherein the second flexible substrate has a thickness of about 5 μm to about 50 μm.

5. The flexible display apparatus as claimed in claim 1, wherein the first flexible substrate and the second flexible substrate include a polymer organic material.

6. A method of manufacturing a flexible display apparatus, the method comprising:
forming a first flexible substrate by forming a first polymer layer on a supporting layer and carbonizing or graphitizing the first polymer layer;
forming a metal layer on the first flexible substrate;
forming a second flexible substrate by forming a second polymer layer on the metal layer;
forming a barrier layer on the second flexible substrate;
forming a thin film transistor (TFT) on the barrier layer; and
forming an organic light-emitting device (OLED) electrically connected to the TFT.

7. The method as claimed in claim 6, wherein forming the first flexible substrate includes forming the first flexible substrate such that the first flexible substrate has a carbon ratio that is 60% or higher.

8. The method as claimed in claim 6, further comprising forming a metal oxide layer after forming the metal layer and before forming the second flexible substrate.

9. The method as claimed in claim 8, wherein forming the metal oxide layer includes oxidizing a surface of the metal layer.

10. The method as claimed in claim 6, wherein forming the first flexible substrate includes carbonizing the first polymer layer at a temperature of about 300° C. to about 4,000° C.

11. The method as claimed in claim 6, wherein forming the second flexible substrate includes forming the second flexible substrate such that the second flexible substrate has a thickness of about 5 μm to about 50 μm.

12. A flexible substrate, comprising:
a first polymer layer having a carbon ratio that is 60% or higher;
a second polymer layer on the first polymer layer;
a metal layer between the first polymer layer and the second polymer layer; and
a barrier layer disposed on the second polymer layer.

13. The flexible substrate as claimed in claim 12, wherein a metal oxide layer is between the metal layer and the second polymer layer.

14. The flexible substrate as claimed in claim 12, wherein the second polymer layer has a thickness of about 5 μm to about 50 μm.

* * * * *